United States Patent [19]

Yokozawa et al.

[11] Patent Number: 4,503,452

[45] Date of Patent: Mar. 5, 1985

[54] PLASTIC ENCAPSULATED SEMICONDUCTOR DEVICE AND METHOD FOR MANUFACTURING THE SAME

[75] Inventors: Masami Yokozawa, Kyoto; Isao Kanai, Shiga, both of Japan

[73] Assignee: Matsushita Electronics Corporation, Osaka, Japan

[21] Appl. No.: 378,435

[22] Filed: May 14, 1982

[30] Foreign Application Priority Data

May 18, 1981 [JP] Japan ................................ 56-75444

[51] Int. Cl.³ .................... H01L 21/58; H01L 21/56; H01L 23/34; H01L 23/00
[52] U.S. Cl. .......................................... 357/72; 70/81; 70/74
[58] Field of Search ....................... 357/70, 72, 81, 74

[56] References Cited

U.S. PATENT DOCUMENTS 3,611,250 10/1971 Reed ..................................... 357/72
3,716,764 2/1973 Birchler et al. ........................ 357/70
3,793,709 2/1974 Baumann ............................... 357/70

FOREIGN PATENT DOCUMENTS 0111766 9/1979 Japan ................................ 357/81 C
0019646 2/1981 Japan .................................... 357/72
0062344 5/1981 Japan .................................... 357/72
2028584 3/1980 United Kingdom .................. 357/70

Primary Examiner—Andrew J. James
Assistant Examiner—S. V. Clark
Attorney, Agent, or Firm—Burgess, Ryan & Wayne

[57] ABSTRACT

A plastic encapsulated semiconductor device and a method for manufacturing the same are provided. A substrate support supports a semiconductor substrate and serves as a heat sink. Strips are connected to one side of the substrate support and an external lead is connected to the opposite side of the substrate support. Parts of the strips extend from one side surface of a plastic encapsulating housing. At least one notch or recess is formed in one side surface of the plastic encapsulating housing. The strips are then cut within at least one notch or recess so as not to extend the cut surfaces of the strips from the outermost side surface portion of the encapsulating housing.

4 Claims, 15 Drawing Figures

PLASTIC ENCAPSULATED SEMICONDUCTOR DEVICE AND METHOD FOR MANUFACTURING THE SAME

BACKGROUND OF THE INVENTION

I. Field of the Invention

The present invention relates to a relatively high-power plastic encapsulated semiconductor device and a method for manufacturing the same.

II. Description of the Prior Art

Plastic encapsulated semiconductor devices are superior to metal encapsulated semiconductor devices in ease of mass production and manufacturing costs. However, the plastic encapsulated semiconductor devices are inferior to the metal encapsulated semiconductor devices in radiation of heat when they are operated. Plastic encapsulation of semiconductor devices has recently been developed. A high power transistor manufactured by plastic encapsulation has been proposed. In this case, sufficient consideration is taken to allow for the radiation of heat.

In a transistor adhered on a metal substrate support and encapsulated by plastic, for example, the lower surface of the substrate support is not covered with plastic but exposed. The substrate support is mounted on a radiator to radiate heat. However, in this case, the substrate support must be electrically insulated from the radiator. The mounting operation of the semiconductor device and the radiator through an insulating plate is complicated and cumbersome.

On the other hand, a plastic encapsulated power transistor is proposed wherein a thin plastic layer is formed on the lower surface of the substrate support during plastic encapsulation and an insulating plate is not required for mounting the power transistor on the radiator. However, in this case, at the time of plastic encapsulation, only the side of the lead frame from which extend the external lead is clamped by the upper and lower molds with a transistor assembly which has the external lead on one side. Plastic is injected while the substrate support is floating in a cavity defined by the molds. Thus, the substrate support may be bent in the cavity due to the injection pressure of the plastic. As a result, it is very difficult to encapsulate in plastic while keeping the substrate support in a proper position, thus, resulting in non-uniformity in the thickness of the plastic layer on the lower surface of the substrate support and degrading radiation characteristics.

The present applicant proposed a method for manufacturing a plastic encapsulated semiconductor device in Japanese Patent Application No. 32229/1981 (corresponding to U.S. patent application Ser. No. 06/352,119, filed Feb. 25, 1982) wherein a semiconductor device assembly is formed using a lead frame which has an external lead extending from one side of a substrate support and strips extending from the opposite side of the substrate support; and the external lead and the strips are clamped by upper and lower molds so as to float the substrate support in a cavity defined by the upper and lower molds during plastic encapsulation. According to this method, the substrate support is properly held and may not be bent regardless of the injection pressure of the plastic. Therefore, the thickness of a thin plastic layer formed on the rear surface of the substrate support may be made uniform and may be controlled with high precision.

However, the cut surfaces of the strips are exposed on the side surface of the plastic encapsulating housing of the semiconductor device. When this semiconductor device is mounted in electrical equipment, the cut surfaces may come into contact with other components, resulting in short-circuiting. The semiconductor device of this type has therefore required further improvement.

SUMMARY OF THE INVENTION

It is, therefore, an object of the present invention to provide a plastic encapsulated semiconductor device and a method for manufacturing thereof wherein the cut surfaces of strips connected to one side of a semiconductor substrate support having the opposite side from which an external lead extends do not extend from the outermost surface portion of the side surface of a plastic encapsulating housing.

According to the present invention, a notch or recess is formed in the plastic encapsulating housing side surface from which the strips extend. The strips are cut off in the notch or recess. As a result, the cut surfaces of the strips do not extend from the outermost surface of the plastic encapsulating housing. Therefore, when this semiconductor device is mounted in electrical equipment, the cut surfaces of the strips may not come into contact with other components, thus preventing short-circuiting and improving the mounting efficiency.

Other objects, features and advantages of the present invention will be apparent from the following description when taken in conjunction with the accompanying drawings.

DETAILED DESCRIPTION OF THE PRIOR ART

Figure 1:
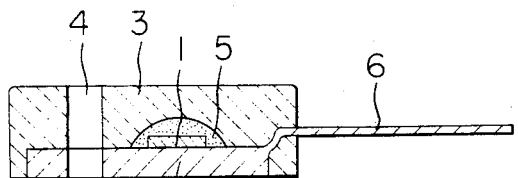
FIGS. 1 and 2 are sectional views of conventional plastic encapsulated type power transistors, respectively.

FIG. 1 is a sectional view of a conventional power transistor of the plastic encapsulated structure. The lower surface of a substrate support 2 on which a transistor element 1 is adhered and which serves as a heat sink is not covered with a plastic encapsulating housing 3 but exposed. A through hole 4 is formed for mounting the power transistor on the radiator with a screw. Reference numeral 5 denotes a protective plastic portion and reference numeral 6 denotes an external lead. When the plastic encapsulated power transistor with the above structure is to be mounted on the radiator (not shown), the exposed lower surface of the substrate support 2 must be thermally coupled with the radiator but must be electrically insulated therefrom. This electrical insulation may be performed by insertion of an insulating plate such as a mica plate.

With the above structure, the heat radiation effect is guaranteed. However, the insulating plate must be inserted between the radiator and the substrate support when the substrate support is to be mounted on the radiator, resulting in a complicated packaging operation. Furthermore, the insulating plate must be properly inserted between the radiator and the substrate support. When the insulating plate, the radiator and the substrate support are to be integrally adhered, they may be misaligned. Thus, electrical insulation cannot be guaranteed.

Figure 2:
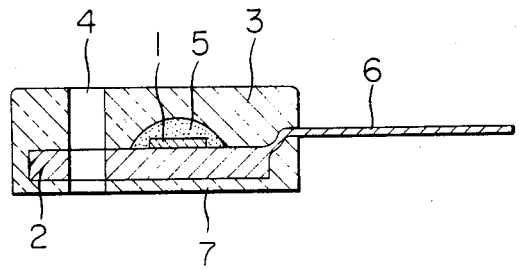

Therefore, as shown in FIG. 2, a plastic encapsulated power transistor is proposed wherein a thin plastic layer 7 is formed on the lower surface of the substrate support 2 and the insulating plate is not required.

Figure 3:
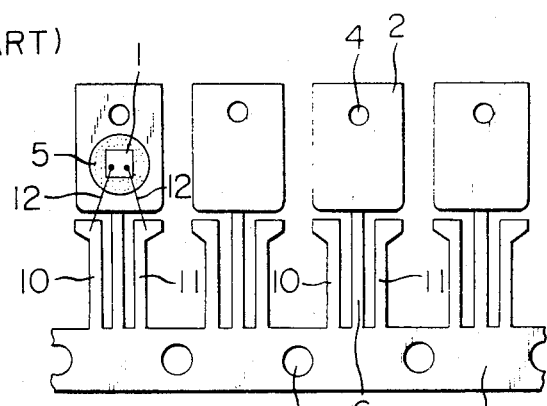
FIG. 3 is a plan view of a conventional lead frame.
Figure 4:
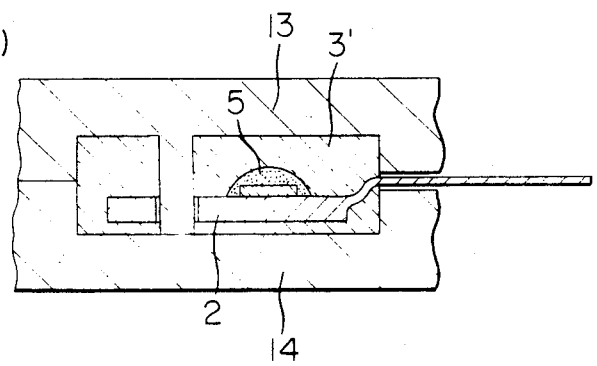
FIG. 4 is a view illustrating the state of plastic encapsulated for forming the plastic encapsulated power transistor of FIG. 2 using the lead frame shown in FIG. 3.

FIG. 3 is a plan view of a lead frame which is conventionally used for packaging the plastic encapsulated power transistor of FIGS. 1 and 2. External leads 6, 10 and 11 of the power transistor extend in one direction from a connecting band 9 on which apertures 8 for determining the feed pitch and positioning the substrate support 2 at the time of plastic encapsulation are formed. As shown in FIG. 4, the substrate support 2 is connected to the end of the external lead 6. As shown in the leftmost transistor, the transistor is mounted in such a manner that the transistor element 1 is affixed to base 2, metal wires 12 are connected between the external lead 10 and 11 and electrodes of the transistor element 1 corresponding thereto, and a protective plastic portion 5 is formed.

A transistor assembly is obtained, using the lead frame as described above. This transistor assembly is formed into a plastic encapsulated structure shown in FIG. 2 in the following manner. As shown in FIG. 4, the substrate support 2 of the transistor assembly is floated in a cavity formed between an upper mold 13 and a lower mold 14. Plastic 3' is then injected into the cavity. The plastic 3' is also filled in the cavity immediately under the lower surface of the substrate support 2. Thus, the plastic encapsulated power transistor of FIG. 2 is manufactured.

As is apparent from FIG. 4, when the plastic encapsulated structure of FIG. 2 is to be obtained by using the lead frame of FIG. 3, plastic is injected into the cavity while only the side on which the external leads are formed is clamped between the upper and lower molds. The substrate support 2 may be bent within the cavity due to the injection pressure of the plastic. Therefore, it is very difficult to dispose the substrate support 2 in a proper position. If the substrate support 2 is bent, the uniform thickness of the thin plastic layer 7 is not obtained. Further, this non-uniformity in thickness directly results in degradation of radiation characteristics.

A method for manufacturing a plastic encapsulated semiconductor device shown in FIG. 2 by using the lead frame shown in FIG. 5 is disclosed in Japanese Patent Application No. 32,229/1981 of the present applicant. In this plastic encapsulated semiconductor device, a very thin plastic layer is uniformly formed with high precision on the rear surface of the substrate support serving as a heat sink and having a semiconductor substrate thereon.

Figure 5A:
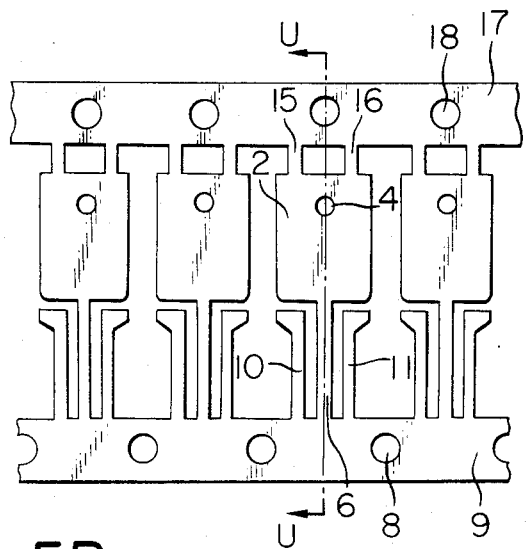
FIGS. 5A and 5B are respectively a plan view and a sectional view of the conventional lead frame used in a plastic encapsulated power transistor to which the present invention is applied.
Figure 5B:
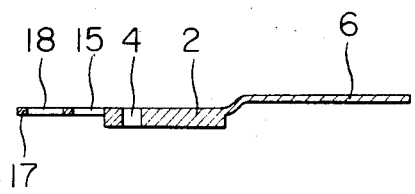

FIG. 5A is a plan view of the lead frame proposed by the same applicant, and FIG. 5B is a sectional view when taken along the line U—U in FIG. 5A. Referring to FIG. 5, strips 15 and 16 extend from one side of the substrate support 2 and are connected to a second connecting band 17. The external lead 6 extends from the opposite side of the substrate support 2. Apertures 18 are formed in the second connecting band 17 and projections of the upper mold are fitted in the respective apertures for proper alignment during plastic encapsulation.

As shown in FIG. 5B, the thickness of the strips 15 and 16 is smaller than that of the substrate support 2. A predetermined step is formed between the rear surfaces of the strips 15 and 16 and the rear surface of the substrate support 2.

Figure 6:
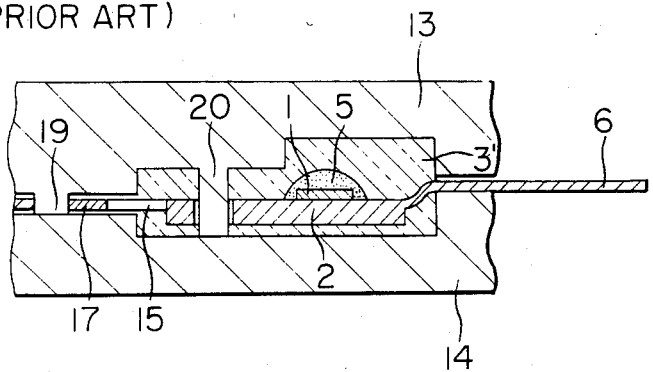
FIGS. 6 to 8 are views for explaining the steps for manufacturing the conventional plastic encapsulated semiconductor device using the lead frame shown in FIGS. 5A and 5B.

FIG. 6 is a view illustrating the state of plastic encapsulation of the transistor assembly formed by using the lead frame shown in FIG. 5. The plastic 3' is injected into the cavity formed between the upper and lower molds 13 and 14 in the same manner as in the conventional plastic encapsulation. However, when the lead frame shown in FIG. 5 is used, as shown in the figure, the external lead 6 of the lead frame is clamped by the upper and lower molds 13 and 14 on one side. At the same time, the strips 15 and 16 and the second connecting band 17 are clamped by the upper and lower molds 13 and 14 on the other side. Projections (not shown) of the upper mold 13 fit in the apertures 8 formed in the first connecting band 9. Simultaneously, projections 19 of the upper mold 13 fit in the apertures 18 of the second connecting band 17. Reference numeral 20 denotes a projection of the upper mold 13 which forms a through hole for mounting the semiconductor device to a radiator with a screw.

Thus, the substrate support 2 of the lead frame is supported by the external lead 6 and the strips 15 and 16 which are clamped by the upper and lower molds 13 and 14, and floats in the cavity of the molds. The first and second connecting bands 9 and 17 are clamped by the upper and lower molds 13 and 14, as described above. Further, the projections of the upper mold 13 are fitted in the apertures formed in the first and second connecting bands 9 and 17. Therefore, horizontal movement of the lead frame relative to the molds is completely prohibited, and the floating state of the substrate support 2 is accurately controlled.

Figure 7:
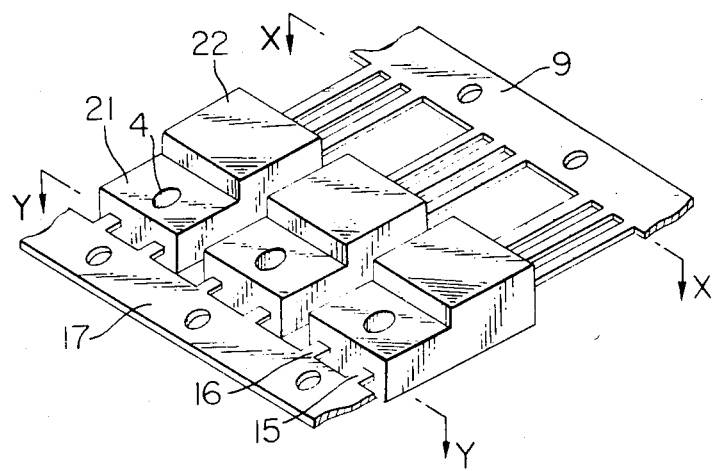

FIG. 7 is a perspective view illustrating the condition after the plastic encapsulation is completed. As shown in the figure, the plastic encapsulating housing has a thin portion 21 in which the through hole 4 for a screw is disposed and a thick portion 22. A step is formed between the thin portion 21 and the thick portion 22, so that the head of the screw does not extend upward when the transistor is mounted to the radiator.

The external leads 6, 10 and 11 are cut from the first connecting band 9 along the line X—X and the strips 15 and 16 are cut along the line Y—Y. Thus, the plastic encapsulated transistor shown in FIG. 8 is manufactured.

Figure 8:
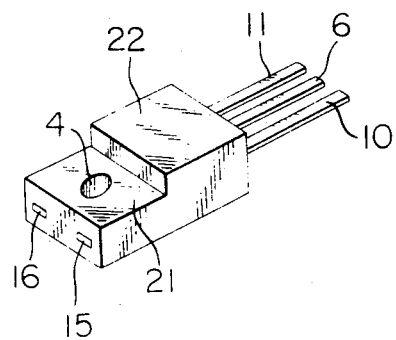

In the plastic encapsulated power transistor shown in FIG. 8, a thin plastic layer which covers the rear surface of the substrate support is formed uniformly. Therefore, good results are obtained when this semiconductor device is directly mounted on a radiator.

As is apparent from FIG. 8, the cut surfaces of the strips 15 and 16 are exposed to one side surface of the plastic encapsulating housing, while the external lead 6 extends from the opposite side surface of the plastic encapsulating housing. The cut surfaces are electrically connected to the substrate support which is embedded in the plastic encapsulating housing. Therefore, when the power transistor is mounted in electrical equipment, good care must be taken so as not to bring the cut surfaces in contact with other components. Further improvements have been thus desired for safe operation.

DETAILED DESCRIPTION OF THE PREFERRED EMBODIMENTS

Figure 9:
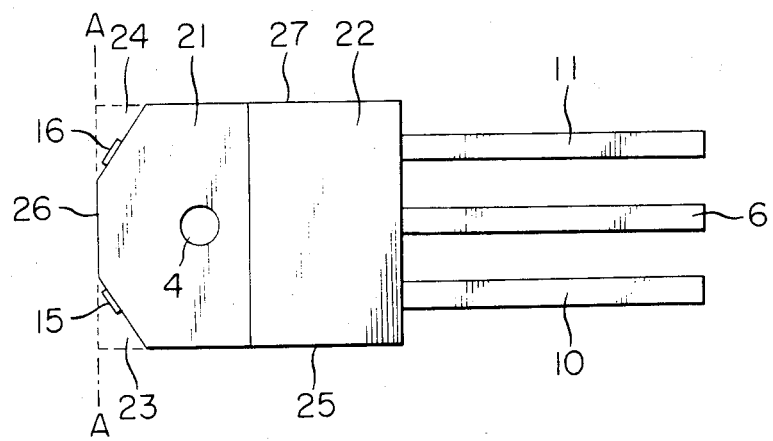
FIGS. 9 to 11 are plan views of plastic encapsulated semiconductor devices according to first to third embodiments of the present invention.

FIG. 9 shows a plastic encapsulating housing which has notches 23 and 24 at a thin portion 21 according to one embodiment of the present invention. The strips 15 and 16 are cut at the notches 23 and 24. Although the cut surfaces of the strips 15 and 16 are exposed at the side surface of the plastic encapsulating housing, the strips 15 and 16 are within the notches 23 and 24. Therefore, short-circuiting does not occur on the side surface indicated by the line A—A even if conductors are brought into contact with this surface. In other words, side surfaces 25 to 27 of the plastic encapsulating housing serve as the surfaces for preventing short-circuiting of the strips 15 and 16.

The power transistor with the above structure is especially suitable to be mounted on a radiator which has fins to surround the power transistor.

Figure 10:
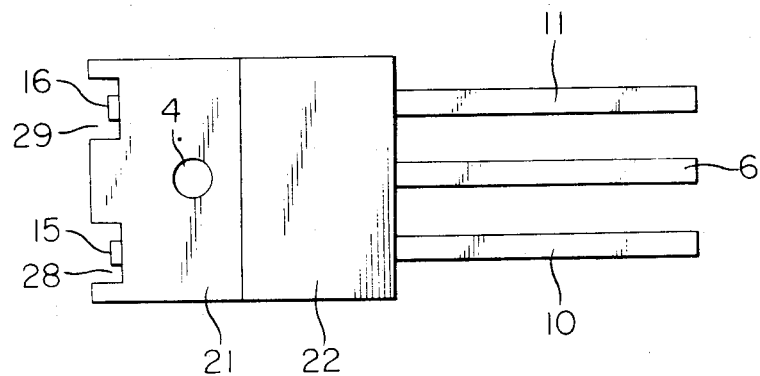
Figure 11:
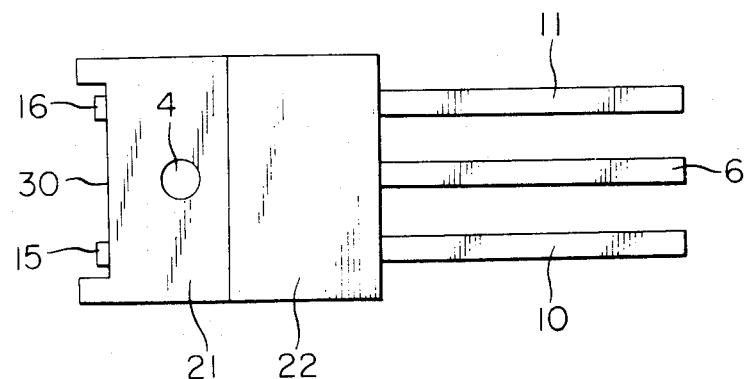

FIG. 10 shows a plastic encapsulated semiconductor device having recesses 28 and 29 instead of the notches according to a second embodiment of the present invention, and FIG. 11 shows a plastic encapsulated semiconductor device having a recess 30 instead of the notches according to a third embodiment. The strips 15 and 16 are cut off in the recesses 28 and 29, respectively, in FIG. 10, while the strips 15 and 16 are cut off in the recess 30 in FIG. 11. The same results as obtained by the notches in FIG. 9 are obtained by the recesses 28, 29 and 30.

The side surfaces of the plastic encapsulating housings of the power transistors shown in FIGS. 9 to 11, respectively, can be defined as surfaces which contact with other components without short-circuiting. Thus, the mounting operation is efficiently performed.

In order to describe a method for manufacturing the plastic encapsulated semiconductor devices shown in FIGS. 9 to 11, a method for manufacturing the semiconductor device having the recess 30 shown in FIG. 11 will be described as an example.

Figure 12:
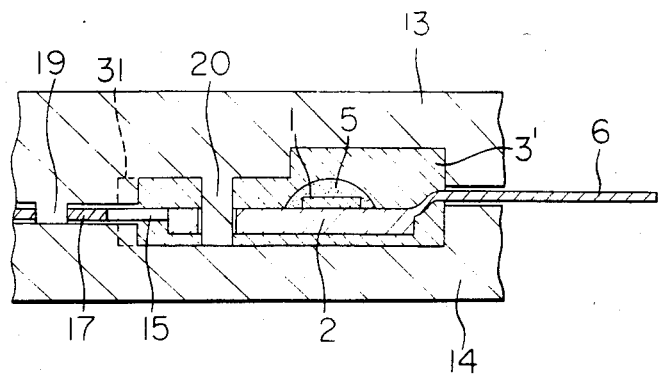
FIGS. 12 to 14 are views for explaining the steps of manufacturing the plastic encapsulated semiconductor device according to the third embodiment of the present invention.

A lead frame shown in FIG. 5 is prepared in which the two strips 15 and 16 of the lead frame extend from one side of the substrate support 2, and the external lead 6 of the lead frame extend from the opposite side of the substrate support 2. The two strips 15 and 16 are then connected to the second connecting band 17. The transistor element 1 is adhered to the substrate support 2 to form a transistor assembly. The transistor assembly is then encapsulated by a plastic, as shown in FIG. 12. The power transistor shown in FIG. 12 is manufactured in the same manner as that using the lead frame shown in FIG. 3, as far as a plastic 3' is injected into a cavity between the upper and lower molds 13 and 14. However, in the power transistor using the lead frame shown in FIG. 5, the external lead 6 of the lead frame is clamped at one side of the upper and lower molds 13 and 14. Simultaneously, the strips 15 and 16 and the second connecting band 17 are clamped at the other side of the upper and lower mold 13 and 14. Projections (not shown) of the upper mold are fitted in the apertures 8 of the first connecting band 9 and projections 19 of the upper mold 13 are fitted in the apertures 18 of the second connecting band 17. Projections 20 of the upper mold 13 are used to form screw holes of the power transistors, respectively.

The upper and lower molds 13 and 14 clamp the external lead 6 and the strips 15 and 16 which, in turn, support the substrate support 2. Thus, the substrate support 2 floats in the cavity of the molds. The first and second connecting band 9 and 17 are clamped by the upper and lower molds 13 and 14 and projections of the upper mold 13 are fitted in the apertures in the first and second connecting band 9 and 17. Therefore, horizontal movement of the lead frame relative to the molds is completely prohibited, and the floating state of the substrate support 2 is accurately controlled. Projections 31 are formed in the upper and lower molds 13 and 14 to form the recess 30 of the power transistor, as indicated by the broken line in FIG. 12.

Figure 13:
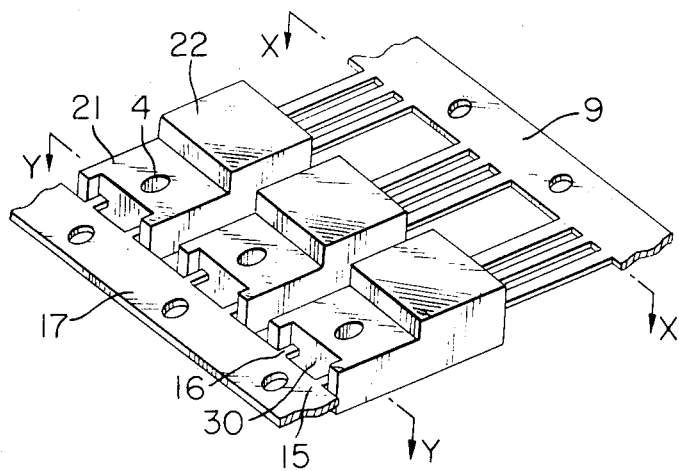
Figure 14:
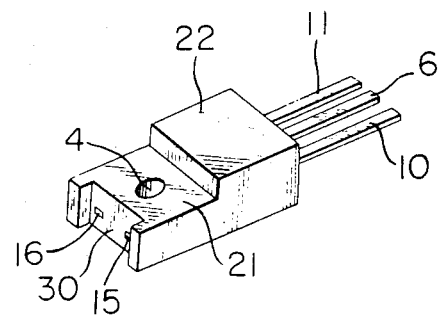

FIG. 13 is a perspective view of the plastic encapsulated semiconductor devices. The recess 30 is formed in the plastic encapsulating housing of the power transistor. The plastic encapsulating housing has the thin portion 21 and the thick portion 22. A step is formed between the portions 21 and 22 so as not to extend the head of screw from the level corresponding to the upper surface of the thick portion 22 when the power transistor is mounted to the radiator. The first connecting band 9 is cut off along the line X—X and the strips 15 and 16 are cut along the line Y—Y to obtain the plastic encapsulated power transistor having the recess 30.

The shape of the recess or notch according to the plastic encapsulated semiconductor device of the present invention may be apparently changed according to the shape of the cavity formed in the molds.

In summary, a thin plastic is uniformly formed with high encapsulation precision on the rear surface of the substrate support which also serves as the heat sink. Further, since the recess or notch is formed in the plastic encapsulating housing, and the strips are cut off in the notch or recess, the semiconductor device may not be short-circuited when it is mounted in electrical equipment. Further, the mounting operation is easily performed to guarantee safety.

What is claimed is:

1. A plastic encapsulated semiconductor device comprising a semiconductor device on a support substrate embedded in a plastic encapsulating housing having a top surface, bottom surface and side surfaces, external leads, connected to said semiconductor device, extending from a side surface of said housing, a notched portion on a side surface opposite to the side surface from which said external leads extend, said substrate support having strips connected thereto which extend to said side having the notched portion, said strips being cut off within said notched portion to prevent electrical contact with said strips.

2. A device according to claim 1, wherein said notched portion of said plastic encapsulating housing comprises a plurality of notches on said side surface opposite to the side surface from which said external leads extend.

3. A device according to claim 1, wherein said side surface opposite to the side surface from which said external leads extend has two corners and said notched portion of said plastic encapsulating housing comprises notches at both corners of said side surface of said plastic encapsulating housing opposite to the side surface from which said external leads extend.

4. A device according to claim 1, wherein said notched portion of said plastic encapsulating housing comprises at least one recess formed at said side surface of said plastic encapsulating housing opposite to the side surface from which said external leads extend.

* * * * *